United States Patent
Oyamada et al.

(10) Patent No.: US 10,840,208 B2
(45) Date of Patent: Nov. 17, 2020

(54) BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Daizo Oda, Saitama (JP); Takashi Yamada, Saitama (JP)

(73) Assignees: NIPPON STEEL CHEMICAL & MATERIAL CO., LTD, Tokyo (JP); NIPPON MICROMETAL CORPORATION, Saitama (JP)

( * ) Notice: Subject to any disclaimer, the term of this patent is extended or adjusted under 35 U.S.C. 154(b) by 364 days.

(21) Appl. No.: 15/537,390

(22) PCT Filed: Dec. 11, 2015

(86) PCT No.: PCT/JP2015/084823
§ 371 (c)(1),
(2) Date: Jun. 16, 2017

(87) PCT Pub. No.: WO2016/098707
PCT Pub. Date: Jun. 23, 2016

(65) Prior Publication Data
US 2017/0365576 A1 Dec. 21, 2017

(30) Foreign Application Priority Data
Dec. 17, 2014 (JP) .................................. 2014-255111

(51) Int. Cl.
*H01L 23/00* (2006.01)
*B23K 35/02* (2006.01)
(Continued)

(52) U.S. Cl.
CPC .......... *H01L 24/45* (2013.01); *B23K 35/0227* (2013.01); *B23K 35/3006* (2013.01); *B23K 35/322* (2013.01); *H01L 24/43* (2013.01); *H01L 24/48* (2013.01); *H01L 24/05* (2013.01); *H01L 24/85* (2013.01); *H01L 2224/05624* (2013.01); *H01L 2224/435* (2013.01); *H01L 2224/437* (2013.01); *H01L 2224/4321* (2013.01); *H01L 2224/43125* (2013.01); *H01L 2224/43825* (2013.01); *H01L 2224/43826* (2013.01); *H01L 2224/43827* (2013.01); *H01L 2224/43848* (2013.01); *H01L 2224/45015* (2013.01); *H01L 2224/45105* (2013.01); *H01L 2224/45109* (2013.01); *H01L 2224/45111* (2013.01); *H01L 2224/45139* (2013.01); *H01L 2224/45144* (2013.01); *H01L 2224/45147* (2013.01); *H01L 2224/45164* (2013.01); *H01L 2224/45169* (2013.01); *H01L 2224/45541* (2013.01); *H01L 2224/45565* (2013.01); *H01L 2224/45572* (2013.01); *H01L 2224/45605* (2013.01); *H01L 2224/45609* (2013.01); *H01L 2224/45611* (2013.01); *H01L 2224/45639* (2013.01); *H01L 2224/45644* (2013.01); *H01L 2224/45664* (2013.01); *H01L 2224/45669* (2013.01); *H01L 2224/48451* (2013.01); *H01L 2224/48463* (2013.01); *H01L 2224/48465* (2013.01); *H01L 2224/48507* (2013.01); *H01L 2224/78301* (2013.01); *H01L 2224/85045* (2013.01); *H01L 2224/85065* (2013.01); *H01L 2224/85075* (2013.01); *H01L 2224/85203* (2013.01); *H01L 2224/85205* (2013.01); *H01L 2924/00011* (2013.01); *H01L 2924/0102* (2013.01); *H01L 2924/01005* (2013.01); *H01L 2924/01015* (2013.01); *H01L 2924/0132* (2013.01);
(Continued)

(58) Field of Classification Search
None
See application file for complete search history.

(56) References Cited

U.S. PATENT DOCUMENTS

| 2008/0240975 | A1 | 10/2008 | Cho et al. | |
|---|---|---|---|---|
| 2011/0120594 | A1* | 5/2011 | Uno | B32B 15/018 148/23 |
| 2012/0118610 | A1* | 5/2012 | Terashima | C22C 5/02 174/126.2 |

FOREIGN PATENT DOCUMENTS

| CN | 104009015 A | 8/2014 |
|---|---|---|
| JP | H04-079245 A | 3/1992 |

(Continued)

OTHER PUBLICATIONS

Machine translation of JP 2013033811A (translated May 8, 2019) (Year: 2013).*

(Continued)

Primary Examiner — David Sample
Assistant Examiner — Elizabeth Collister
(74) Attorney, Agent, or Firm — McDermott Will & Emery LLP

(57) ABSTRACT

The present invention provides a bonding wire capable of simultaneously satisfying ball bonding reliability and wedge bondability required of bonding wires for memories, the bonding wire including a core material containing one or more of Ga, In, and Sn for a total of 0.1 to 3.0 at % with a balance being made up of Ag and incidental impurities; and a coating layer formed over a surface of the core material, containing one or more of Pd and Pt, or Ag and one or more of Pd and Pt, with a balance being made up of incidental impurities, wherein the coating layer is 0.005 to 0.070 μm in thickness.

12 Claims, No Drawings

(51) Int. Cl.
*B23K 35/30* (2006.01)
*B23K 35/32* (2006.01)

(52) U.S. Cl.
CPC .............. *H01L 2924/01034* (2013.01); *H01L 2924/01057* (2013.01); *H01L 2924/10253* (2013.01); *H01L 2924/181* (2013.01)

(56) References Cited

FOREIGN PATENT DOCUMENTS

| | | |
|---|---|---|
| JP | 2001-176912 A | 6/2001 |
| JP | 2007-123597 A | 5/2007 |
| JP | 2013033811 A | 2/2013 |
| JP | 2013-139635 A | 7/2013 |
| WO | 2013/076548 A1 | 5/2013 |
| WO | 2014/129745 A1 | 8/2014 |

OTHER PUBLICATIONS

Machine translation of JP 2001196912A (translated May 8, 2019) (Year: 2001).*
Machine translation of JP 2007123597A (translated May 8, 2019) (Year: 2007).*
Machine translation of CN 104009015A (translated May 9, 2019) (Year: 2014).*
Notification of Reasons for Refusal issued in Japanese Patent Application No. 2014-255111, dated Dec. 11, 2018 (English translation).
Search Report issued in corresponding International Patent Application No. PCT/JP2015/084823, dated Mar. 1, 2016.
Extended European Search Report issued in corresponding European Patent Application No. 15869912.4, dated Jul. 27, 2018.

* cited by examiner

BONDING WIRE FOR SEMICONDUCTOR DEVICE

CROSS REFERENCE

This application is the U.S. National Phase under 35 U.S.C. § 371 of International Application No. PCT/JP2015/084823, filed on Dec. 11, 2015, which claims the benefit of Japanese Application No. 2014-255111, filed on Dec. 17, 2014, the entire contents of each are hereby incorporated by reference.

TECHNICAL FIELD

The present invention relates to a bonding wire for a semiconductor device used to connect electrodes on semiconductor elements with wiring such as external leads of a circuit wiring board.

BACKGROUND ART

Currently, as bonding wires for a semiconductor device (hereinafter referred to as bonding wires) for bonding electrodes on semiconductor elements with external leads, fine wires approximately 15 to 50 μm in wire diameter are mainly used. As a method for bonding the bonding wire, a thermosonic bonding process is used commonly together with a general-purpose bonding machine, a capillary jig adapted to connect a bonding wire passed therethrough, and the like. A bonding wire bonding process involves heat-melting a wire tip by arc heat input, forming a ball portion by surface tension, pressure-bonding the ball portion (hereinafter referred to as ball bonding) to an electrode of a semiconductor element heated in a range of 150 to 300° C., then forming a loop, and pressure-bonding a wire portion to an electrode on the side of the external lead (hereinafter referred to as wedge bonding) to complete the process. An electrode structure made up of an alloy film composed principally of Al and formed on a Si substrate or an electrode structure in which the electrode on the side of the external lead is plated with Ag or Pd is often used for the electrode on the semiconductor element to which the bonding wire is bonded.

Good ball formability, ball bondability, wedge bondability, loop formability, and other performance are required of the bonding wire. As a bonding wire material which generally satisfies these performance requirements, Au is used mainly. On the other hand, due to recent escalation of Au prices, intensive development of bonding wires using less expensive materials than Au has been going on. Recently, in the memory field in which bonding wires using Au (hereinafter referred to as Au bonding wires) go mainstream, development aiming at replacing Au with an inexpensive material has been going on.

One reason why Au bonding wires are used in the memory field is that Au has low electric resistance and provides excellent wedge bondability. The lower the electric resistance, the larger the electric current which can be passed through one bonding wire. This makes it possible to reduce the total number of bonding wires, reduce memory size, and achieve high productivity. Also, Au is soft and is highly resistant to surface deterioration phenomena such as surface oxidation. Consequently, Au bonding wires, which provide excellent wedge bondability even in bonding under low energy conditions, can reduce damage to semiconductor elements during wedge bonding, where the damage poses a problem for increasingly thinned semiconductor elements for memories.

As a material which satisfies performance requirements for bonding wires for memories and has lower cost than Au, Ag is drawing attention. The specific resistance of Ag, which is 1.6 μΩ·cm, is lower than the specific resistance of Au, which is 2.2 μΩ·cm, and thus Ag is advantageous over Au from the perspective of reduction in specific resistance. Also, the Young's modulus of Ag (about $83 \times 10^9$ N/m$^2$) is approximately equal to the Young's modulus of Au (about $80 \times 10^9$ N/m$^2$). Ag has high resistance to surface deterioration phenomena as well. Therefore, a bonding wire made of Ag (hereinafter referred to as a Ag bonding wire) is expected to provide excellent wedge bondability equivalent to that of the Au bonding wire.

However, the Ag bonding wire, which is inferior to the Au bonding wire in terms of bonding reliability of ball bonds (hereinafter abbreviated to ball bonding reliability), is considered to be difficult to put to practical use as a bonding wire for memories. For evaluation of the ball bonding reliability, a high-temperature shelf test, a high-temperature high-humidity test, and other tests which evaluate semiconductor life under accelerated conditions are available for use. The Ag bonding wire, with which separation of ball bonds occurs in a shorter time than with the Au bonding wire in the high-temperature high-humidity test, has a problem in aiming at putting the Ag bonding wire to practical use as a bonding wire for memories. This is because when separation of ball bonds occurs, electrical connections are impaired in the ball bonds, causing defects of semiconductor devices.

As a method for solving the problem of ball bonding reliability, Patent Literature 1 discloses a technique for alloying Ag with Au and Pd, and reports a Ag—Au alloy containing 0.01 to 30.00 wt. % of Au with the remainder being made up of Ag, a Ag—Pd alloy containing 0.01 to 10.00 wt. % of Pd with the remainder being made up of Ag, and a Ag—Au—Pd alloy containing 0.01 to 30.00 wt. % of Au and containing 0.01 to 10.00 wt. % of Pd with the remainder being made up of Ag. As a method for solving the problem of ball bonding reliability, Patent Literature 2 discloses a structure in which a coating layer of Pd or Pt is provided on an outer circumference of a Ag alloy.

CITATION LIST

Patent Literature

Patent Literature 1: Japanese Patent Laid-Open No. 2013-139635
Patent Literature 2: Japanese Patent Laid-Open No. 2013-33811

SUMMARY OF INVENTION

Technical Problem

The present inventors evaluated the Ag bonding wires disclosed in the related patent literatures and found that the Ag bonding wires were not able to satisfy standards for the ball bonding reliability and wedge bondability required of the bonding wire for memories.

First, the ball bonding reliability required of the bonding wire for memories will be described. Generally, the ball bonding reliability is evaluated by high-temperature testing or high-temperature high-humidity testing. When a Ag bonding wire is used, separation of ball bonds poses a problem especially in a high-temperature high-humidity environment. It is considered that the separation of ball bonds in high-temperature high-humidity testing is caused by corrosion of part of a Ag—Al intermetallic compound and subsequent reduction in adhesion of an interface between Ag and a corrosion product. Conventionally, a test called PCT (Pressure Cooker Test) and a test called uHAST (unbiased Highly Accelerated temperature and humidity Stress Test) are mainstream in the high-temperature high-humidity testing, where PCT is conducted under conditions of 121° C. temperature and 100% relative humidity while uHAST is conducted under conditions of 130° C. temperature and 85% relative humidity. In late years, the requirements for ball bonding reliability has become more stringent, and it is required to exhibit performance in a test called HAST in which deterioration is further accelerated by applying to ball bonds a bias voltage of 3.6 V in a temperature and humidity environment of uHAST. The bonding wires for memories are required to operate properly even after 120 hours of HAST.

Next, the wedge bondability required of the bonding wire for memories will be described. The wedge bondability is evaluated based on the presence or absence of a bonding defect in wedge bonds after the bonding wire is bonded. The bonding defect is defined herein as a condition in which the bonding wire is separated from a lead-side electrode. The bonding wire for memories is required to be free of any bonding defect when a Ag electrode on the side of the external lead is wedge-bonded in a temperature zone of 175° C. or below under a low energy condition.

Patent Literature 1 described above states that when doped with Pd, Au, or the like, the bonding wire of Ag can improve ball bonding reliability in a high-temperature high-humidity environment. However, the bonding wire described above cannot satisfy criteria for ball bonding reliability required of the bonding wires for memories. In improving ball bonding reliability, it is useful to increase concentrations of alloying elements, but there is a problem in that the wire becomes harder, resulting in decreased wedge bondability. Therefore, it is difficult to simultaneously satisfy ball bonding reliability and wedge bondability required of the bonding wires for memories simply through Ag alloy design. Also, because Ag is prone to adsorb sulfur, there is a problem in that sulfur adsorbing to wire surfaces obstructs diffusion of Ag during wedge bonding, resulting in decreased wedge bondability.

Patent Literature 2 described above states that the bonding wire disclosed therein and structured such that a coating layer of Pd or Pt is provided on a surface of Ag can improve ball bonding reliability in a high-temperature high-humidity environment. However, whereas ball bonding reliability is considered to vary with the constituent elements and thickness of a coating layer, the bonding wire described above cannot satisfy the criteria for ball bonding reliability required of the bonding wires for memories. Regarding wedge bondability, improvements are seen using an element lower in sulfur absorbency than Ag in the coating layer, but there is a problem in that adhesion of an interface between the coating layer and Ag is low and that the coating layer is separated from Ag in the wedge bonding.

Even when Ag alloy design and a technique for providing a coating layer on a surface of the Ag alloy are combined, ball bonding reliability required of the bonding wires for memories cannot be achieved.

For the above reasons, it was found that the Ag bonding wire disclosed in each or combination of the patent literatures was not able to simultaneously satisfy ball bonding reliability and wedge bondability required of the bonding wires for memories.

An object of the present invention is to provide a bonding wire which can solve the above problems and simultaneously satisfy ball bonding reliability and wedge bondability required of bonding wires for memories.

Solution to Problem

A bonding wire according to the present invention includes: a core material containing one or more of Ga, In, and Sn for a total of 0.1 to 3.0 at %, and a balance being made up of Ag and incidental impurities; and a coating layer formed over a surface of the core material, containing one or more of Pd and Pt, or Ag and one or more of Pd and Pt, and a balance being made up of incidental impurities, wherein the coating layer is 0.005 to 0.070 µm in thickness.

Advantageous Effects of Invention

The present invention can simultaneously satisfy ball bonding reliability and wedge bondability.

DESCRIPTION OF EMBODIMENTS

Ball Bonding Reliability and Wedge Bondability

After conducting active studies, the present inventors have found that in order to simultaneously satisfy ball bonding reliability and wedge bondability, it is necessary to appropriately control an element added to a core material and concentration thereof as well as an element used for a coating layer and film thickness of the coating layer.

Effectiveness of the bonding wire according to the present embodiment for ball bonding reliability will be described. An effective element to be added to the core material made of Ag is Ga, In, or Sn and effective concentration of the element is 0.1 at. % or above. An effective element to be used for the coating layer is Pd or Pt and an effective thickness of the coating layer is 0.005 µm or above. That is, when the bonding wire according to the present embodiment was used, separation did not occur in a ball bond between the bonding wire and Al electrode even after 120 hours of HAST. Electrical connections were not lost either. Ga, In, or Sn contained in the core material of the bonding wire according to the present embodiment and Pd or Pt contained in the coating layer were able to inhibit growth of an intermetallic compound of Ag and Al in the ball bond during a high-temperature high-humidity test. It is believed that this is because a compound layer mainly made up of the element contained in the core material and element contained in the coating layer was formed in a bonding interface of the ball bond, effectively inhibiting diffusion of Ag and Al. Thus, it became evident that the bonding wire according to the present embodiment satisfies criteria for ball bonding reliability required of bonding wires for memories.

Next, effectiveness of the bonding wire according to the present embodiment for wedge bondability will be described. An effective element to be contained in the core material is Ga, In, or Sn and an effective concentration is 0.05 at. % to 3.0 at. % (both inclusive) in terms of a total concentration of one or more of Ga, In, and Sn. An effective element to be used for the coating layer is Pd or Pt and an effective thickness of the coating layer is 0.003 µm to 0.070 µm (both inclusive). That is, when the bonding wire according to the present embodiment was used, there was no bonding defect even when wedge bonding was done at a temperature of 175° C. under a low energy condition. Reasons why excellent wedge bondability was achieved will be described below. The first reason is that softness can be maintained by appropriately controlling the total concentration of one or more of Ga, In, and Sn contained in the core material. The second reason is that sulfur adsorption can be inhibited by providing a coating layer around the core material, the coating layer containing one or more of Pd and Pt, or Ag and one or more of Pd and Pt, with a balance being made up of incidental impurities. The third reason is that separation of the coating layer during wedge bonding can be inhibited by appropriately controlling the element added to the core material, the element used for the coating layer, and the thickness of the coating layer and thereby increasing adhesion between the core material and coating layer. Thus, it became evident that the bonding wire according to the present embodiment satisfies criteria for wedge bondability required of bonding wires for memories.

To simultaneously satisfy the criteria for ball bonding reliability and wedge bondability required of the bonding wires for memories, an effective bonding wire includes: a core material containing one or more of Ga, In, and Sn for a total of 0.1 to 3.0 at % with a balance being made up of Ag and incidental impurities; and a coating layer formed over a surface of the core material, containing one or more of Pd and Pt, or Ag and one or more of Pd and Pt, with a balance being made up of incidental impurities, wherein the coating layer is 0.005 to 0.070 μm in thickness. It was shown that the bonding wire according to the present embodiment can reduce cost compared to a Au bonding wire while satisfying performance requirements of the bonding wires for memories, and thus can be substituted for a Au bonding wire.

Here, when less than 0.1 at % in total of one or more of Ga, In, and Sn is contained, growth of an intermetallic compound of Ag and Al which can cause corrosion in a high-temperature high-humidity test has been inhibited insufficiently and the ball bonding reliability required in memory use cannot be achieved. A bonding wire containing more than 3.0 at % in total of one or more of Ga, In, and Sn is not suitable for practical use because of increased bonding wire strength and reduced wedge bondability. The total concentration of 0.2 to 1.5 at. % combines softness with high ductility and provides excellent wedge bondability, and thus is preferable. Furthermore, if the total concentration is 0.3 to 1.0 at. %, the bonding wire provides more excellent wedge bondability, and thus is more preferable.

Of the elements contained in the core material, preferably 0.1 to 3.0 at % of one or more of In and Sn are contained because of a more excellent improvement effect on ball bonding reliability. This is because In or Sn contained in the core material has a particularly excellent growth inhibition effect on the intermetallic compound of Ag and Al in the bonding interface.

The concentration of Ga, In, and Sn contained in the core material of the bonding wire according to the present embodiment can be measured in a core material portion using an energy dispersive X-ray spectrometer (EDX) or the like provided on an Auger electron spectroscope (AES), scanning electron microscope (SEM), or transmission electron microscope (TEM). Methods available to expose the core material include a method which involves burying a bonding wire in resin and exposing a section by mechanical polishing and a method which involves shaving a surface of the bonding wire by an Ar ion beam.

The coating layer of the bonding wire according to the present embodiment is defined to be a region in which a total concentration of Pd, Pt, and Au is 50 at. % or above out of a region marked off by linking a surface and center of the bonding wire with a straight line. Thickness and composition of the coating layer of the bonding wire can be measured using an Auger electron spectroscope. A specific method involves taking concentration measurements by shaving the surface of the bonding wire by sputtering or the like and acquiring concentration profiles in a depth direction first. Elements whose concentration profiles are acquired are Ag, Ga, In, Sn, Pd, and Pt. Next, the total concentration of Pd and Pt is calculated based on the acquired concentration profiles. The thickness of the coating layer may be measured at a single location, but preferably an average of measured values taken at two or more locations is used.

Ball Formability

Next, effectiveness of the bonding wire according to the present embodiment for improvement of ball formability will be described. The bonding wire according to the present embodiment has an alloy layer between the core material and the coating layer, the alloy layer containing one or more of Ga, In, and Sn, one or more of Pd and Pt, and Ag, with a balance being made up of incidental impurities, consequently it is possible to inhibit generation of a ball with low sphericity (hereinafter referred to as a deformed ball) in the case of balls with a small diameter (hereinafter referred to as small-diameter balls). The small-diameter ball is defined to be a ball whose diameter is 1.5 to 1.7 times a wire diameter of the bonding wire. Normally, the ball diameter is in a range of 1.7 to 2.5 times the wire diameter of the bonding wire.

In forming balls of the Ag bonding wire, to stabilize arc discharges, nitrogen or mixed gas of nitrogen and 3 to 5% of hydrogen is blown. Deformed shapes are caused by a discrepancy in timing of melting between the surface and inner part when the surface of the bonding wire is melted by arc discharges. Regarding this problem, generation of deformed balls can be inhibited by providing an alloy layer between the core material and coating layer, the alloy layer containing one or more of Ga, In, and Sn, one or more of Pd and Pt, and Ag, with a balance being made up of incidental impurities. This is because when the alloy layer is formed, a melting point gradient changes continuously from the surface to the inner part of the bonding wire, allowing the wire to melt continuously from the surface to the inner part. When nitrogen gas is blown, generation of deformed balls can be inhibited even when no gas is used.

The alloy layer is defined to be a region in which a total concentration of Pd and Pt is 5 to 50 at. % and the concentration of Ga, In, and Sn is higher than in a center portion of the bonding wire, out of a region marked off by linking a surface and center of the bonding wire with a straight line. Preferably, the thickness of the alloy layer is 10 to 60% the thickness of the coating layer, because the arc discharges are stabilized with respect to small-diameter balls, making it possible to inhibit variation in ball diameter. Composition of the alloy layer can be measured by a method similar to the one used to measure the composition of the coating layer. A specific method involves taking concentration measurements by shaving the surface of the bonding wire by sputtering or the like and acquiring concentration profiles in the depth direction. Elements whose concentration profiles are acquired are Ag, Ga, In, Sn, Pd, and Pt. Next, the total concentration of Pd and Pt is calculated based on the acquired concentration profiles. The thickness and composition of the alloy layer may be measured at a single location, but preferably averages of measured values taken at two or more locations are used.

Capillary Life

Next, effectiveness of the bonding wire according to the present embodiment for capillary life will be described. The bonding wire according to the present embodiment has a Au-containing region containing 15 to 50 at.% Au on an outeiuiost surface of the coating layer, thereby reducing friction between the bonding wire surface and a capillary and thereby improving service life of the capillary. This is because Au is softer than Pd and Pt of the coating layer and superior in ductility. An effective thickness of the Au-containing region is 0.001 to 0.050 μm because this will provide an excellent improvement effect. When concentration of Au is less than 15 at% or the thickness of the Au-containing region is less than 0.001 μm, the improvement effect is insufficient. When the concentration of Au is more than 50 at.% or the thickness of the Au-containing region is more than 0.050 μm, a capillary life improvement effect cannot be obtained because Au may get clogged in the capillary. The thickness and composition of the Au-containing region can be measured using an Auger electron spectroscope. Regarding a specific method, the Au-containing region can be measured by a method similar to the one used to measure the composition of the coating layer.

Crimped Ball Shape

Next, effectiveness of the bonding wire according to the present embodiment for crimped ball shape will be described. Along with downsizing of memory packages, distances between electrodes of semiconductor elements have been becoming shorter. Conventionally, during ball bonding of a Ag bonding wire, balls deform preferentially in an application direction of ultrasound and may sometimes come into contact with an adjacent electrode, causing a short circuit. Therefore, it is necessary to reduce anisotropy of ball deformation during ball bonding and maintain collapsed shape close to a perfect circle. The anisotropy of ball deformation tends to increase with increases in grain size, and thus a technique which refines crystal grains of ball portions is useful. By further containing one or more of Cu, Pd, Pt, and Au for a total of 0.1 to 0.7 at. % in the core material, the bonding wire according to the present embodiment can refine the crystal grains of balls and attain a ball shape closer to a perfect circle. If the concentration is less than 0.1 at. %, a ball shape improvement effect cannot be obtained. Also, a concentration more than 0.7 at. % is not suitable for practical use because the balls become harder and chip damage during bonding poses a problem. The concentration of Pd, Pt, and Au contained in the core material of the bonding wire can be measured in a core material portion using an EDX provided on an AES, SEM, or TEM. Methods available to expose the core material include a method which involves burying a bonding wire in resin and exposing a section by mechanical polishing and a method which involves shaving a surface of the bonding wire by an Ar ion beam.

Loop Formability

Next, effectiveness of the bonding wire according to the present embodiment for loop formability will be described. By containing one or more of B, P, Ca, La, and Se for a total of 80 to 500 at. ppm in the bonding wire, the bonding wire according to the present embodiment including the core material, coating layer, and alloy layer can improve straightness of a loop. Along with recent downsizing of memory packages, electrode pitches on the lead side as well as bonding distances between bonding wires are reduced. To prevent short circuits caused by contact between wires, high straightness is required of bonding wires. By containing one or more of B, P, Ca, La, and Se for a total of 80 to 500 at. ppm, bending strength can be improved and thus the bonding wire according to the present embodiment provides high loop straightness. Here, if the concentration is less than 80 at. ppm, an improvement effect on loop straightness cannot be obtained. Also, a concentration more than 500 at. ppm is not suitable for practical use because the balls become harder and chip damage during bonding poses a problem. The concentration of the B, P, Ca, La, and Se contained in the bonding wire can be measured using an ICP (Inductively Coupled Plasma) emission spectrophotometer.

Production Method

Next, a production method of the bonding wire according to the present embodiment will be described.

Core Material

A Ag alloy used for the core material of the bonding wire can be produced by simultaneously dissolving raw materials. An arc furnace, high-frequency furnace, resistance heating furnace, or the like can be used for the dissolution. Procedures for that involve charging the raw materials into a carbon crucible machined into a cylindrical shape 3 to 6 mm in diameter, dissolving the raw materials by heating to 1100 to 1500° C. in vacuum or in an inert atmosphere of $N_2$, Ar, or other gas, and then furnace-cooling or air-cooling the materials to complete the process. The resulting Ag alloy is formed to a final wire diameter by repeating a drawing process using dies.

Coating Layer

Methods available to form the coating layer include a technique for forming a film to become the coating layer on a Ag alloy wire of the final wire diameter and a technique for forming the film on a thick Ag alloy wire of an intermediate wire diameter and then drawing the wire to the final wire diameter. The former technique, which forms the film using the final wire diameter, makes quality control simple and easy while the latter technique, which draws the wire after forming the film using the intermediate wire diameter, is advantageous in improving adhesion to the core material. Each of the production methods will be described concretely.

As a method for forming a film of Pd and Pt on a surface of the Ag alloy, a plating method, vapor deposition method, fusion method, or the like can be used. Regarding the plating method, either electrolytic plating process or electroless plating process can be used for production. Electrolytic plating processes called strike plating and flash plating have high plating rates and provide good adhesion to undercoating. Solutions used for electroless deposition are classified into a substitution type and a reduction type. Substitution plating alone is enough for a small film thickness, but in forming a thick film, it is useful to apply reduction plating in stages after substitution plating. Regarding the vapor deposition method, physical adsorption such as a sputtering process, an ion plating process, and vacuum deposition as well as chemical adsorption such as plasma CVD (Chemical Vapor Deposition) are available for use. Any of the processes is a dry type, which eliminates the need for cleaning after formation of the coating layer, and thus there is no need to worry about surface contamination during cleaning.

A technique for forming a film on the Ag alloy wire of the final wire diameter will be described. A cylindrical Ag alloy 3 to 6 mm in diameter obtained by dissolution is formed to a diameter of 0.9 to 1.2 mm by a drawing process. Subsequently, a wire drawing process is performed continuously using dies to produce a wire 300 to 600 µm in diameter. In so doing, an acid cleaning process using hydrochloric acid or the like is effective in improving quality by removing oxides, sulfides, and the like from the surface. Subsequently, the wire is formed to the final wire diameter of 15 to 25 µm by repeating a wire drawing process. A commercially available lubricant is used for wire drawing, and a wire feed rate during the wire drawing is 300 to 1000 m/min.

In forming a film on the Ag alloy wire of the final wire diameter, one effective method involves forming a film of 0.010 to 0.140 µm (in thickness) containing one or more of Pd and Pt, or Ag and one or more of Pd and Pt on a surface of the Ag alloy wire and then performing final heat treatment. The final heat treatment is effective if performed by continuously sweeping the wire because this provides high productivity. Final heat treatment conditions need to be set such that the thickness of the coating layer can be kept within an appropriate range. Specifically, it is useful to set final heat treatment temperature to 200 to 600° C., and control heat treatment time within a range of 0.2 to 1.0 second(s). As a result of the final heat treatment, elements in the Ag alloy wire and elements in the film formed on the surface of the Ag alloy wire diffuse mutually, allowing the thickness of the coating layer to be controlled within a range of 0.005 to 0.070 µm. Also, use of the final heat treatment conditions makes it possible to recrystallize the work-hardened Ag alloy, and thereby simultaneously achieve softening required of bonding wires.

Next, a technique for forming a film on a thick Ag alloy wire of an intermediate wire diameter and then drawing the wire to a final wire diameter will be described. A cylindrical Ag alloy 3 to 6 mm in diameter obtained by dissolution is formed to a diameter of 0.9 to 1.2 mm by a drawing process. Subsequently, a wire drawing process is performed continuously using dies to produce a wire 300 to 600 µm in diameter. A film containing one or more of Pd and Pt, or Ag and one or more of Pd and Pt is formed on the Ag alloy wire 300 to 600 µm in diameter. In so doing, thickness of the film needs to be changed according to wire diameter of the Ag alloy wire at the time of film formation and the final wire diameter of the bonding wire. Specifically, the thickness of the film can be adjusted to be 0.010 to 0.140 µm when the final wire diameter is reached. Now, let $R_1$ denote the wire diameter of the Ag alloy wire at the time of film formation, let $r_1$ denote the thickness of the film, and let $R_2$ denote the wire diameter of the Ag alloy wire when the final wire diameter is reached, then the film thickness $r_2$ on the final wire diameter is given by expressions (1) to (3) below. The unit of all the dimensions is µm.

$$r_2=(R_2/R_1)r_1 \quad (1)$$

$$0.010 \le r_2 < 0.140 \quad (2)$$

from expressions (1) and (2)

$$0.010 \le (R_2/R_1)r_1 < 0.140 \quad (3)$$

Being sufficiently large compared to the thickness of the film, the wire diameter of the Ag alloy wire when the final wire diameter is reached can be approximated as $R_2 \approx R$, where R denotes the final wire diameter of the bonding wire. Thus, expression (3) can be given as expression (4) below.

$$0.010 \le (R/R_1)r_1 < 0.140 \quad (4)$$

From expression (4), it can be said that once the wire diameter on which the film is formed and the final wire diameter are determined, the thickness of the film formed on the wire with a wire diameter of 300 to 600 µm can be determined. Subsequently, the wire is formed to the final wire diameter of 15 to 25 µm by repeating a wire drawing process and then subjected to final heat treatment. The final heat treatment is effective if performed by continuously sweeping the wire because this provides high productivity. The final heat treatment conditions need to be set such that the thickness of the coating layer can be controlled within an appropriate range. Specifically, it is useful to set final heat treatment temperature to 200 to 600° C., and control heat treatment time within a range of 0.2 to 1.0 seconds. The elements in the Ag alloy wire and the elements in the film formed on the surface of the Ag alloy wire diffuse mutually, allowing the thickness of the coating layer to be controlled within a range of 0.005 to 0.070 µm.

Alloy Layer

In order to form the alloy layer between the core material and coating layer, it is useful to perform additional heat treatment after the final heat treatment. This facilitates diffusion of Ga, In, and Sn contained in the Ag alloy toward the coating layer. Additional heat treatment conditions are set to 600 to 700° C., and when the thickness of the alloy layer is controlled, it is useful to change heat treatment time. In the heat treatment temperature range, if the heat treatment time is set to 0.2 to 0.5 seconds, the thickness of the alloy layer can be set within a range of 10 to 60% the thickness of the coating layer. Regarding a method for additional heat treatment, a method of carrying out additional heat treatment by continuously sweeping the wire is available for use.

Au-Containing Region

Au-containing layer can be provided on the outermost surface of the coating layer using a method similar to the method for forming the coating layer. Also, the thickness and composition of the Au-containing region can be controlled using a method similar to the method for forming the coating layer. That is, available methods include a method of forming the coating layer when the wire is processed to an intermediate wire diameter and then forming a Au film and a method of forming the coating layer when the wire is processed to the final wire diameter and then forming a Au film. For example, to form the Au film, after forming the coating layer on the Ag alloy wire of the final wire diameter, effective methods include a method of performing final heat treatment after forming an Au film of 0.0008 to 0.04 µm (in thickness).

Example 1

Examples will be described in detail below. A bonding wire was created using the production method described above. The Ag used as a raw material had a purity of 99.99 at % or above and the balance was made up of incidental impurities. The Ga, In, Sn, Cu, Pd, Pt, Au, B, P, Ca, La, and Se used had a purity of 99.9 at % or above with the balance being made up of incidental impurities. Elements with a concentration of 10 at. ppm or below were regarded as incidental impurities. A coating layer was formed using a technique for forming a film of Pd and Pt on a thick Ag alloy wire of an intermediate wire diameter and then drawing the wire to a final wire diameter. As a method for forming a film of Pd and Pt on a surface of the Ag alloy, an electrolytic plating process was used. The wire was immersed in a plating solution while being swept continuously. As a method for forming a Au-containing region on the outermost surface of the coating layer, the electrolytic plating process was also used. In this case again, the wire was immersed in a plating solution while being swept continuously.

Evaluation of Ball Bonding Reliability

Regarding ball bonding reliability, after conducting a high-temperature high-humidity test under conditions of 130° C. temperature, 85% relative humidity, and 3.6V bias voltage, bond life was evaluated. Samples were created by bonding the bonding wire to semiconductor elements using a commercially available bonding machine and molding the bonded semiconductor elements with an epoxy sealing resin. Al electrodes 1 μm thick were used as electrodes of the semiconductor elements. By conducting a shear test of the ball bonds every 24 hours, the bond life of the ball bonds was defined as the time at which the value of the shear strength became ⅓ the shear strength obtained initially. After the high temperature high humidity test, the ball bonds were exposed by removing resin by acid treatment before conducting the shear test. A commercially available micro strength tester was used as a shear tester. As the value of shear strength, an average value of measured values of ball bonds at ten locations selected at random was used. In the above evaluation, when the bond life was shorter than 120 hours, a triangle mark was given by judging that there was a problem in practical use; when the bond life was equal to or longer than 120 hours and shorter than 168 hours, a single circle mark was given by judging that there was no problem in practical use; and when the bond life was equal to or longer than 168 hours, a double circle mark was given by judging that the result was excellent.

Evaluation of wedge Bondability

Wedge bonding was carried out on a device having a structure in which plural semiconductor elements were stacked, using the bonding wire with a wire diameter of 15 to 20 μm. The temperatures used during bonding were 175° C., 160° C., and 150° C. and Ag was used as an electrode material on the lead side. A low energy bonding condition in which ultrasound output was lower than under a normal condition was used. By observing 1,000 wedge bonds in each sample subjected to bonding, a pass/fail judgment was made based on whether or not there was a defect. The defect is defined here as a condition in which the bonding wire is separated from the electrode. In wedge bonding at 175° C., when there was a defect, a triangle mark was given by judging that there was a problem in practical use; and when there was no defect, a single circle mark was given by judging that there was no problem in practical use. When there was no defect in wedge bonding at 160° C., a double circle mark was given by judging that the result was excellent; and when there was no defect in wedge bonding at 150° C., a star-shaped mark was given by judging that the result was particularly excellent.

Evaluation of Ball Formability

Ball formability was evaluated by forming balls using a commercially available bonding machine and observing the external appearance of the balls. Regarding a ball formation condition, $N_2$ 5% $H_2$ gas was used. The diameter of the balls was 1.5 times the wire diameter. An optical microscope was used to observe the external appearance of the balls. Using the evaluation method described above, the ball formability was judged based on the number of balls with low sphericity among 200 balls selected randomly. When the number of balls with low sphericity was 3 or 4, a single circle mark was given by judging that there was no problem in practical use; and when the number of balls with low sphericity was 2 or less, a double circle mark was given by judging that the result was excellent.

Evaluation of Capillary Life

The capillary life was evaluated based on the presence or absence of wear by observing the capillary after bonding the bonding wire using a commercially available bonding machine. The wire diameter of the bonding wire was 20 μm and the number of trials of bonding was 5000. The hole at the tip of the capillary was observed under an SEM, and when the capillary was serviceable without problem even if the hole was out of round due to wear, a single circle mark was given by judging that there was no problem in practical use; and when a perfect circle was maintained, a double circle mark was given by judging that the result was excellent.

Evaluation of Crimped Ball Shape

The crimped ball shape was evaluated as follows: electrodes were created by forming an Al film 1.0 μm thick on a Si substrate and ball-bonded using a commercially available wire bonder, and observed from directly above using an optical microscope. Collapsed shapes of balls were judged as follows: a collapsed shape close to a circular shape was judged to be good and a collapsed shape oval or petaline was judged to be defective. One hundred ball bonds were observed under an optical microscope, and when there were one to four defective bonds, a single circle mark was given by judging that there was no problem in practical use; and when there was no defective bond, a double circle mark was given by judging that the result was particularly excellent.

Evaluation of Loop Formability

The loop formability was evaluated as follows: bonding was done using a commercially available wire bonder and it was judged, by observing loop portions, whether or not loops were in contact with each other. The loop length was 2.5 mm and loop height was 0.2 mm. Loop portions of 200 bonding wires after bonding were observed under an optical microscope and any point where adjacent bonding wires were in contact with each other was judged to be defective. When there were one to four defects, a single circle mark was given by judging that there was no problem in practical use, and when there was no defect, a double circle mark was given by judging that the result was particularly excellent.

Tables 1-1 to 1-3 show examples describing features such as the compositions of the bonding wires according to the present invention as well as describing evaluation results of the respective bonding wires.

Table 2-1 and Table 2-2 show comparative examples.

TABLE 1-1

| Example | Core Ga concentration (at. %) | In concentration (at. %) | Sn concentration (at. %) | Cu concentration (at. %) | Pd concentration (at. %) | Pt concentration (at. %) | Au concentration (at. %) | Coating layer Pd | Pt | Coating layer thickness (μm) |
|---|---|---|---|---|---|---|---|---|---|---|
| 1 | 0.10 | | | | | | | ○ | | 0.005 |
| 2 | 0.20 | | | | | | | ○ | | 0.050 |
| 3 | 0.30 | | | | | | | ○ | | 0.045 |
| 4 | 1.00 | | | | | | | ○ | | 0.008 |
| 5 | 1.50 | | | | | | | ○ | | 0.030 |
| 6 | 2.90 | | | | | | | ○ | | 0.061 |
| 7 | 0.10 | | | | | | | | ○ | 0.055 |
| 8 | 0.20 | | | | | | | | ○ | 0.009 |
| 9 | 0.30 | | | | | | | | ○ | 0.015 |
| 10 | 1.00 | | | | | | | | ○ | 0.063 |
| 11 | 1.50 | | | | | | | | ○ | 0.068 |
| 12 | 2.90 | | | | | | | | ○ | 0.056 |
| 13 | 0.10 | | | | | | | ○ | ○ | 0.039 |
| 14 | 2.90 | | | | | | | ○ | ○ | 0.029 |
| 15 | 0.10 | | | | | | | ○ | | 0.028 |
| 16 | 2.90 | | | | | | | ○ | | 0.014 |
| 17 | 0.10 | | | | | | | | ○ | 0.050 |
| 18 | 2.90 | | | | | | | | ○ | 0.060 |
| 19 | 0.10 | | | | | | | ○ | ○ | 0.049 |
| 20 | 2.90 | | | | | | | ○ | ○ | 0.047 |
| 21 | 0.06 | 0.05 | | | | | | ○ | | 0.060 |
| 22 | 0.12 | 0.90 | | | | | | ○ | | 0.067 |
| 23 | 0.17 | 0.15 | | | | | | ○ | | 0.054 |
| 24 | 0.20 | 0.90 | | | | | | ○ | | 0.045 |
| 25 | 0.30 | | | | | | | ○ | | 0.046 |
| 26 | 0.40 | | | | | | | ○ | | 0.050 |
| 27 | 0.30 | | | | | | | ○ | | 0.080 |
| 28 | 0.30 | | | | | | | ○ | | 0.033 |
| 29 | 0.30 | | | | | | | ○ | ○ | 0.034 |
| 30 | 0.40 | | | | | | | ○ | ○ | 0.043 |
| 31 | 0.30 | | | | | | | ○ | ○ | 0.038 |
| 32 | 0.30 | | | | | | | ○ | ○ | 0.039 |
| 33 | 0.30 | | | 0.1 | | | | ○ | | 0.006 |
| 34 | 0.30 | | | | | 0.2 | | ○ | ○ | 0.055 |
| 35 | 0.20 | | 0.5 | | | | | ○ | ○ | 0.021 |
| 36 | 0.60 | | | | 0.6 | | | ○ | ○ | 0.010 |
| 37 | 1.40 | | | | | 0.6 | | ○ | ○ | 0.062 |
| 38 | 1.60 | | | | 0.1 | 0.1 | | ○ | | 0.068 |
| 39 | 1.20 | | | | 0.1 | | 0.1 | ○ | ○ | 0.012 |
| 40 | 0.70 | | | | 0.5 | 0.1 | | ○ | | 0.031 |
| 41 | 0.90 | | | | 0.5 | | 0.1 | ○ | ○ | 0.046 |
| 42 | 1.20 | | 0.1 | | 0.4 | 0.1 | | ○ | ○ | 0.031 |
| 43 | 1.50 | | | | 0.4 | 0.1 | 0.1 | ○ | ○ | 0.032 |
| 44 | 1.20 | | 0.1 | | 0.1 | 0.1 | 0.1 | ○ | | 0.046 |

| Example | Alloy layer (Alloy layer thickness)/ (Covering layer thickness) × 100 (%) | Au-containing region Au concentration (at. %) | Thickness (μm) | Added element B concentration (at. ppm) | P concentration (at. ppm) | Ca concentration (at. ppm) | La concentration (at. ppm) | Se concentration (at. ppm) |
|---|---|---|---|---|---|---|---|---|
| 1 | 0 | | | | | | | |
| 2 | 5 | | | | | | | |
| 3 | 40 | | | 83 | | | | |
| 4 | 30 | | | | 120 | | | |
| 5 | 25 | | | | | 19 | | |
| 6 | 34 | | | | | | 26 | |
| 7 | 0 | | | | | | | 41 |
| 8 | 56 | | | 20 | | | | |
| 9 | 70 | | | | 480 | | | |
| 10 | 23 | | | | | 82 | | |
| 11 | 30 | | | | | | 86 | |
| 12 | 34 | | | | | | | 89 |
| 13 | 14 | | | 40 | 50 | | | |
| 14 | 20 | | | 30 | | 80 | | |
| 15 | 60 | | | 150 | | | 200 | |
| 16 | 75 | | | | 30 | | | 60 |
| 17 | 35 | | | | | | | |
| 18 | 9 | | | | | | | |

TABLE 1-1-continued

| | | | | | | | | |
|---|---|---|---|---|---|---|---|---|
| 19 | 24 | | | | | | | |
| 20 | 18 | | | | | | | |
| 21 | 4 | | | | | | | |
| 22 | 29 | | | | | | | |
| 23 | 34 | | | | | | | |
| 24 | 28 | | | | | | | |
| 25 | 40 | 15 | 0.0007 | | | | | |
| 26 | 45 | 20 | 0.0010 | | | | | |
| 27 | 45 | 48 | 0.0500 | | | | | |
| 28 | 50 | 53 | 0.0600 | | | | | |
| 29 | 40 | 18 | 0.0007 | | | | | |
| 30 | 45 | 30 | 0.0010 | | | | | |
| 31 | 45 | 50 | 0.0500 | | | | | |
| 32 | 50 | 56 | 0.0600 | | | | | |
| 33 | 0 | | | | | | | |
| 34 | 0 | | | 420 | | | | |
| 35 | 23 | | | | 425 | | | |
| 36 | 24 | | | | | 418 | | |
| 37 | 72 | | | | | | 438 | |
| 38 | 36 | | | | | | | 486 |
| 39 | 24 | | | | | | | |
| 40 | 17 | | | | | | | |
| 41 | 34 | | | | | | | |
| 42 | 36 | | | | | | | |
| 43 | 32 | | | | | | | |
| 44 | 42 | | | | | | | |

TABLE 1-2

| | Core | | | | | | | Coating layer | | |
|---|---|---|---|---|---|---|---|---|---|---|
| Example | Ga concentration (at. %) | In concentration (at. %) | Sn concentration (at. %) | Cu concentration (at. %) | Pd concentration (at. %) | Pt concentration (at. %) | Au concentration (at. %) | Pd | Pt | Coating layer thickness (μm) |
| 45 | | | 0.10 | | | | | ○ | | 0.042 |
| 46 | | | 0.20 | | 0.3 | | | ○ | | 0.056 |
| 47 | | | 0.30 | | | 0.3 | | ○ | | 0.059 |
| 48 | | | 1.00 | | | | 0.1 | ○ | | 0.069 |
| 49 | | | 1.50 | 0.1 | | | | ○ | | 0.032 |
| 50 | | | 2.90 | | 0.5 | | 0.1 | ○ | | 0.033 |
| 51 | | | 0.10 | | | | | | ○ | 0.011 |
| 52 | | | 0.20 | | | | | | ○ | 0.015 |
| 53 | | | 0.30 | | | | | | ○ | 0.019 |
| 54 | | | 1.00 | | | | | | ○ | 0.013 |
| 55 | | | 1.50 | | | | | | ○ | 0.024 |
| 56 | | | 2.90 | | | | | | ○ | 0.015 |
| 57 | | | 0.10 | | 0.2 | | | ○ | ○ | 0.045 |
| 58 | | | 2.90 | | | 0.1 | | ○ | ○ | 0.024 |
| 59 | | | 0.10 | | | | 0.5 | ○ | ○ | 0.032 |
| 60 | | | 2.90 | 0.2 | | | | ○ | ○ | 0.026 |
| 61 | | | 0.10 | | 0.4 | | 0.4 | ○ | ○ | 0.017 |
| 62 | | | 2.90 | | | | | ○ | ○ | 0.022 |
| 63 | | | 0.10 | | | | | ○ | ○ | 0.025 |
| 64 | | | 2.90 | | | | | ○ | ○ | 0.017 |
| 65 | 0.10 | | | | | | | ○ | | 0.005 |
| 66 | 0.20 | | | | | | | ○ | | 0.060 |
| 67 | 0.30 | | | | | | | ○ | | 0.060 |
| 68 | 1.00 | | | | | | | ○ | | 0.060 |
| 69 | 1.50 | | | | | | | ○ | | 0.060 |
| 70 | 2.90 | | | | | | | ○ | | 0.060 |
| 71 | 0.10 | | | | | | | | ○ | 0.005 |
| 72 | 0.20 | | | | | | | | ○ | 0.060 |
| 73 | 0.30 | | | | | | | | ○ | 0.060 |
| 74 | 1.00 | | | | | | | | ○ | 0.060 |
| 75 | 1.50 | | | | | | | | ○ | 0.060 |
| 76 | 2.90 | | | | | | | | ○ | 0.060 |
| 77 | 0.10 | | | | | | | ○ | ○ | 0.005 |
| 78 | 2.90 | | | | | | | ○ | ○ | 0.060 |
| 79 | 0.10 | | | | | | | ○ | ○ | 0.005 |
| 80 | 2.90 | | | | | | | ○ | ○ | 0.060 |
| 81 | 0.10 | | | | | | | ○ | ○ | 0.005 |
| 82 | 2.90 | | | | | | | ○ | ○ | 0.060 |
| 83 | 0.10 | | | | | | | ○ | ○ | 0.025 |
| 84 | 2.90 | | | | | | | ○ | ○ | 0.017 |

TABLE 1-2-continued

| Example | Alloy layer (Alloy layer thickness)/ (Covering layer thickness) × 100 (%) | Au-containing region Au concentration (at. %) | Au-containing region Thickness (μm) | Added element B concentration (at. ppm) | Added element P concentration (at. ppm) | Added element Ca concentration (at. ppm) | Added element La concentration (at. ppm) | Added element Se concentration (at. ppm) |
|---|---|---|---|---|---|---|---|---|
| 45 | 50 | | | | | | | |
| 46 | 23 | | | | | | | |
| 47 | 24 | | | 34 | | | | |
| 48 | 15 | | | 450 | | | | |
| 49 | 24 | | | 90 | | | | |
| 50 | 25 | | | | | | | |
| 51 | 33 | | | | | | | |
| 52 | 39 | | | | | | | |
| 53 | 40 | | | | 55 | | | |
| 54 | 49 | | | | 495 | | | |
| 55 | 35 | | | | 98 | | | |
| 56 | 55 | | | | | | | |
| 57 | 25 | | | | | | | |
| 58 | 34 | | | | | | | |
| 59 | 25 | | | | | | | |
| 60 | 32 | | | | | | | |
| 61 | 35 | | | | | | | |
| 62 | 25 | | | | | | | |
| 63 | 24 | | | | | | | |
| 64 | 29 | | | | | | | |
| 65 | 57 | | | | | | | |
| 66 | 0 | | | | | | | |
| 67 | 25 | | | 42 | | | | |
| 68 | 40 | | | 444 | | | | |
| 69 | 20 | | | 90 | | | | |
| 70 | 35 | | | | | | | |
| 71 | 50 | | | | | | | |
| 72 | 24 | | | | | | | |
| 73 | 30 | | | | 52 | | | |
| 74 | 44 | | | | 479 | | | |
| 75 | 42 | | | | 91 | | | |
| 76 | 25 | | | | | | | |
| 77 | 55 | | | | | | | |
| 78 | 30 | | | | | | | |
| 79 | 14 | | | | | | | |
| 80 | 34 | | | | | | | |
| 81 | 73 | | | | | | | |
| 82 | 45 | | | | | | | |
| 83 | 24 | | | | | | | |
| 84 | 29 | | | | | | | |

TABLE 1-3

| Example | Operation and effect Bonding reliability (temperature: 130° C.; relative humidity: 85%) | Wedge bondability | Crimped ball shape | Ball formability | Capillary life | Loop formability |
|---|---|---|---|---|---|---|
| 1 | ⊚ | ○ | ○ | ○ | ○ | ○ |
| 2 | ⊚ | ⊚ | ○ | ○ | ○ | ○ |
| 3 | ⊚ | ☆ | ○ | ⊚ | ○ | ⊚ |
| 4 | ⊚ | ☆ | ○ | ⊚ | ○ | ⊚ |
| 5 | ⊚ | ⊚ | ○ | ⊚ | ○ | ○ |
| 6 | ⊚ | ○ | ○ | ⊚ | ○ | ○ |
| 7 | ⊚ | ○ | ○ | ⊚ | ○ | ○ |
| 8 | ⊚ | ⊚ | ○ | ⊚ | ○ | ○ |
| 9 | ⊚ | ☆ | ○ | ○ | ○ | ⊚ |
| 10 | ⊚ | ☆ | ○ | ⊚ | ○ | ⊚ |
| 11 | ⊚ | ⊚ | ○ | ⊚ | ○ | ⊚ |
| 12 | ⊚ | ○ | ○ | ⊚ | ○ | ⊚ |
| 13 | ⊚ | ○ | ○ | ⊚ | ○ | ⊚ |
| 14 | ⊚ | ○ | ○ | ⊚ | ○ | ⊚ |
| 15 | ⊚ | ○ | ○ | ⊚ | ○ | ⊚ |
| 16 | ⊚ | ○ | ○ | ⊚ | ○ | ⊚ |
| 17 | ⊚ | ○ | ○ | ⊚ | ○ | ○ |

TABLE 1-3-continued

| | Operation and effect | | | | | |
|---|---|---|---|---|---|---|
| Example | Bonding reliability (temperature: 130° C.; relative humidity: 85%) | Wedge bondability | Crimped ball shape | Ball formability | Capillary life | Loop formability |
| 18 | ⊚ | ○ | ○ | ○ | ○ | ○ |
| 19 | ⊚ | ○ | ○ | ⊚ | ○ | ○ |
| 20 | ⊚ | ○ | ○ | ⊚ | ○ | ○ |
| 21 | ⊚ | ○ | ○ | ○ | ○ | ○ |
| 22 | ⊚ | ⊚ | ○ | ⊚ | ○ | ○ |
| 23 | ⊚ | ☆ | ○ | ⊚ | ○ | ○ |
| 24 | ⊚ | ⊚ | ○ | ⊚ | ○ | ○ |
| 25 | ⊚ | ☆ | ○ | ⊚ | ○ | ○ |
| 26 | ⊚ | ☆ | ○ | ⊚ | ⊚ | ○ |
| 27 | ⊚ | ☆ | ○ | ⊚ | ⊚ | ○ |
| 28 | ⊚ | ☆ | ○ | ⊚ | ○ | ○ |
| 29 | ⊚ | ☆ | ○ | ⊚ | ○ | ○ |
| 30 | ⊚ | ☆ | ○ | ⊚ | ⊚ | ○ |
| 31 | ⊚ | ☆ | ○ | ⊚ | ⊚ | ○ |
| 32 | ⊚ | ☆ | ○ | ⊚ | ○ | ○ |
| 33 | ⊚ | ☆ | ⊚ | ○ | ○ | ○ |
| 34 | ⊚ | ☆ | ⊚ | ○ | ○ | ⊚ |
| 35 | ⊚ | ☆ | ⊚ | ⊚ | ○ | ⊚ |
| 36 | ⊚ | ☆ | ⊚ | ⊚ | ○ | ⊚ |
| 37 | ⊚ | ⊚ | ⊚ | ○ | ○ | ⊚ |
| 38 | ⊚ | ○ | ⊚ | ⊚ | ○ | ⊚ |
| 39 | ⊚ | ⊚ | ⊚ | ⊚ | ○ | ○ |
| 40 | ⊚ | ☆ | ⊚ | ⊚ | ○ | ○ |
| 41 | ⊚ | ☆ | ⊚ | ⊚ | ○ | ○ |
| 42 | ⊚ | ⊚ | ⊚ | ⊚ | ○ | ○ |
| 43 | ⊚ | ⊚ | ⊚ | ⊚ | ○ | ○ |
| 44 | ⊚ | ⊚ | ⊚ | ⊚ | ○ | ○ |
| 45 | ⊚ | ○ | ○ | ⊚ | ○ | ○ |
| 46 | ⊚ | ⊚ | ⊚ | ⊚ | ○ | ○ |
| 47 | ⊚ | ☆ | ⊚ | ⊚ | ○ | ○ |
| 48 | ⊚ | ☆ | ⊚ | ⊚ | ○ | ⊚ |
| 49 | ⊚ | ⊚ | ⊚ | ⊚ | ○ | ⊚ |
| 50 | ⊚ | ○ | ⊚ | ⊚ | ○ | ○ |
| 51 | ⊚ | ○ | ○ | ⊚ | ○ | ○ |
| 52 | ⊚ | ⊚ | ○ | ⊚ | ○ | ○ |
| 53 | ⊚ | ☆ | ○ | ⊚ | ○ | ○ |
| 54 | ⊚ | ☆ | ○ | ⊚ | ○ | ⊚ |
| 55 | ⊚ | ⊚ | ○ | ⊚ | ○ | ⊚ |
| 56 | ⊚ | ○ | ○ | ⊚ | ○ | ○ |
| 57 | ⊚ | ○ | ⊚ | ⊚ | ○ | ○ |
| 58 | ⊚ | ○ | ⊚ | ⊚ | ○ | ○ |
| 59 | ⊚ | ○ | ⊚ | ⊚ | ○ | ○ |
| 60 | ⊚ | ○ | ⊚ | ⊚ | ○ | ○ |
| 61 | ⊚ | ○ | ○ | ⊚ | ○ | ○ |
| 62 | ⊚ | ○ | ○ | ⊚ | ○ | ○ |
| 63 | ⊚ | ○ | ○ | ⊚ | ○ | ○ |
| 64 | ⊚ | ○ | ○ | ⊚ | ○ | ○ |
| 65 | ○ | ○ | ○ | ⊚ | ○ | ○ |
| 66 | ○ | ⊚ | ○ | ○ | ○ | ○ |
| 67 | ○ | ☆ | ○ | ⊚ | ○ | ○ |
| 68 | ○ | ☆ | ○ | ⊚ | ○ | ⊚ |
| 69 | ○ | ⊚ | ○ | ⊚ | ○ | ⊚ |
| 70 | ○ | ○ | ○ | ⊚ | ○ | ○ |
| 71 | ○ | ○ | ○ | ⊚ | ○ | ○ |
| 72 | ○ | ⊚ | ○ | ⊚ | ○ | ○ |
| 73 | ○ | ☆ | ○ | ⊚ | ○ | ○ |
| 74 | ○ | ☆ | ○ | ⊚ | ○ | ⊚ |
| 75 | ○ | ⊚ | ○ | ⊚ | ○ | ⊚ |
| 76 | ○ | ○ | ○ | ⊚ | ○ | ○ |
| 77 | ○ | ○ | ○ | ⊚ | ○ | ○ |
| 78 | ○ | ○ | ○ | ⊚ | ○ | ○ |
| 79 | ○ | ○ | ○ | ⊚ | ○ | ○ |
| 80 | ○ | ○ | ○ | ⊚ | ○ | ○ |
| 81 | ○ | ○ | ○ | ○ | ○ | ○ |
| 82 | ○ | ○ | ○ | ⊚ | ○ | ○ |
| 83 | ○ | ○ | ○ | ○ | ○ | ○ |
| 84 | ○ | ○ | ○ | ⊚ | ○ | ○ |

TABLE 2-1

| comparative Example | Core Ga concentration (at. %) | In concentration (at. %) | Sn concentration (at. %) | Cu concentration (at. %) | Pd concentration (at. %) | Pt concentration (at. %) | Au concentration (at. %) | Coating layer Pd | Pt | Coating layer thickness (μm) |
|---|---|---|---|---|---|---|---|---|---|---|
| 1 |  | 0.08 |  |  |  |  |  | ○ |  | 0.010 |
| 2 |  |  | 0.07 |  |  |  |  | ○ |  | 0.012 |
| 3 | 0.07 |  |  |  |  |  |  | ○ |  | 0.009 |
| 4 | 0.02 | 0.03 |  |  |  |  |  | ○ |  | 0.012 |
| 5 | 0.01 | 0.01 | 0.02 |  |  |  |  | ○ |  | 0.009 |
| 6 |  | 2.30 |  |  |  |  |  | ○ |  | 0.003 |
| 7 |  |  | 2.50 |  |  |  |  | ○ |  | 0.003 |
| 8 | 2.30 |  |  |  |  |  |  | ○ |  | 0.002 |
| 9 |  | 2.30 |  |  |  |  |  |  | ○ | 0.003 |
| 10 |  |  | 2.50 |  |  |  |  |  | ○ | 0.003 |
| 11 | 2.30 |  |  |  |  |  |  |  | ○ | 0.004 |
| 12 | 3.10 |  |  |  |  |  |  | ○ |  | 0.005 |
| 13 |  | 3.10 |  |  |  |  |  | ○ |  | 0.005 |
| 14 |  |  | 3.10 |  |  |  |  | ○ |  | 0.005 |

| comparative Example | Alloy layer (Alloy layer thickness)/(Covering layer thickness) × 100 (%) | Au-containing region Thickness (μm) | Added element B concentration (at. ppm) | P concentration (at. ppm) | Ca concentration (at. ppm) | La concentration (at. ppm) | Se concentration (at. ppm) |
|---|---|---|---|---|---|---|---|
| 1 | 45 |  |  |  |  |  |  |
| 2 | 44 |  |  |  |  |  |  |
| 3 | 43 |  |  |  |  |  |  |
| 4 | 44 |  |  |  |  |  |  |
| 5 | 43 |  |  |  |  |  |  |
| 6 | 42 |  |  |  |  |  |  |
| 7 | 40 |  |  |  |  |  |  |
| 8 | 45 |  |  |  |  |  |  |
| 9 | 41 |  |  |  |  |  |  |
| 10 | 40 |  |  |  |  |  |  |
| 11 | 42 |  |  |  |  |  |  |
| 12 | 41 |  |  |  |  |  |  |
| 13 | 43 |  |  |  |  |  |  |
| 14 | 43 |  |  |  |  |  |  |

TABLE 2-2

| comparative Example | Operation and effect Bonding reliability (temperature: 130° C., relative humidity: 85%) | Wedge bondability | Crimped ball shape | Ball formability | Capillary life | Loop formability |
|---|---|---|---|---|---|---|
| 1 | △ | ○ | ○ | ◎ | ○ | ○ |
| 2 | △ | ○ | ○ | ◎ | ○ | ○ |
| 3 | △ | ○ | ○ | ◎ | ○ | ○ |
| 4 | △ | ○ | ○ | ◎ | ○ | ○ |
| 5 | △ | △ | ○ | ◎ | ○ | ○ |
| 6 | △ | ○ | ○ | ◎ | ○ | ○ |
| 7 | △ | ○ | ○ | ◎ | ○ | ○ |
| 8 | △ | △ | ○ | ◎ | ○ | ○ |
| 9 | △ | ○ | ○ | ◎ | ○ | ○ |
| 10 | △ | ○ | ○ | ◎ | ○ | ○ |
| 11 | △ | ○ | ○ | ◎ | ○ | ○ |
| 12 | ◎ | △ | ○ | ◎ | ○ | ○ |
| 13 | ◎ | △ | ○ | ◎ | ○ | ○ |
| 14 | ◎ | △ | ○ | ◎ | ○ | ○ |

A bonding wire according to claim 1 corresponds to Nos. 1, 2, 17 to 24, 45, 50 to 52, 56, 62 to 66, 70 to 72, and 76 to 84. It was confirmed that the ball bonding reliability and wedge bondability required by the bonding wires for memories were satisfied.

Since the bonding wires of Examples 1 to 84 included a core material containing one or more of Ga, In, and Sn for a total of 0.1 to 3.0 at % with a balance being made up of Ag and incidental impurities; and a coating layer formed over a surface of the core material, containing one or more of Pd and Pt, or Ag and one or more of Pd and Pt, with a balance being made up of incidental impurities, wherein the coating layer was 0.005 to 0.070 µm in thickness, it was confirmed that the ball bonding reliability and wedge bondability were satisfied simultaneously. In contrast, as shown in Comparative Examples Nos. 1 to 14, it was confirmed that when the concentration of Ga, In, and Sn was outside the above range or the thickness of the coating layer was outside the above range, the ball bonding reliability and wedge bondability were not satisfied simultaneously.

In the bonding wires of Examples 3 to 6, 8, 10 to 15, 17, 19, 20, 22 to 32, 35, 36, 38 to 65, 67 to 80, and 82 to 84, since the thickness of the alloy layer was 10 to 60% the thickness of the coating layer, it was confirmed that the ball formability was excellent.

In the bonding wires of Examples 26, 27, 30, and 31, since the thickness of the Au-containing region containing 15 to 50 at. % of Au was 0.001 to 0.050 µm, it was confirmed that the capillary life was able to be improved.

Since each of the bonding wires of Examples 33 to 44, 46 to 50, and 57 to 60 contained one or more of Cu, Pd, Pt, and Au for a total of 0.1 to 0.7 at. % in the core material, it was confirmed that the evaluation of crimped ball shape was particularly excellent.

Since each of the bonding wires of Examples 3, 4, 9 to 16, 34 to 38, 48, 49, 54, 55, 68, 69, 74, and 75 contained one or more of B, P, Ca, La, and Se for a total of 80 to 500 at. ppm as a whole, it was confirmed that the evaluation of loop formability was particularly excellent.

The invention claimed is:

1. A bonding wire for a semiconductor device comprising:
a core material containing one or more of Ga, In, and Sn for a total of 0.1 to 3.0 at%, and a balance being made up of Ag and incidental impurities; and
a coating layer formed over a surface of the core material, containing one or more of Pd and Pt, or Ag and one or more of Pd and Pt, and a balance being made up of incidental impurities, wherein
the coating layer is 0.005 to 0.070 µm in thickness.

2. The bonding wire according to claim 1, further comprising an alloy layer provided between the core material and the coating layer, the alloy layer containing one or more of Ga, In, and Sn, one or more of Pd and Pt, and Ag, and a balance being made up of incidental impurities.

3. The bonding wire according to claim 2, wherein a thickness of the alloy layer is 10 to 60% the thickness of the coating layer.

4. The bonding wire according to claim 3, further comprising a Au-containing region containing 15 to 50 at.% Au and provided on an outermost surface of the coating layer, wherein a thickness of the Au-containing region is 0.001 to 0.050 µm.

5. The bonding wire according to claim 1, wherein the core material further contains one or more of Cu, Pd, Pt, and Au for a total of 0.1 to 0.7 at.%.

6. The bonding wire according to claim 1, wherein the bonding wire as a whole contains one or more of B, P, Ca, La, and Se for a total of 80 to 500 at. ppm.

7. The bonding wire according to claim 2, wherein the core material further contains one or more of Cu, Pd, Pt, and Au for a total of 0.1 to 0.7 at.%.

8. The bonding wire according to claim 3, wherein the core material further contains one or more of Cu, Pd, Pt, and Au for a total of 0.1 to 0.7 at.%.

9. The bonding wire according to claim 2, wherein the bonding wire as a whole contains one or more of B, P, Ca, La, and Se for a total of 80 to 500 at. ppm.

10. The bonding wire according to claim 3, wherein the bonding wire as a whole contains one or more of B, P, Ca, La, and Se for a total of 80 to 500 at. ppm.

11. The bonding wire according to claim 5, wherein the bonding wire as a whole contains one or more of B, P, Ca, La, and Se for a total of 80 to 500 at. ppm.

12. A bonding wire for a semiconductor device comprising:
a core material containing one or more of Ga, In, and Sn for a total of 0.1 to 3.0 at%, and a balance being made up of Ag and incidental impurities;
a coating layer formed over a surface of the core material, containing one or more of Pd and Pt, or Ag and one or more of Pd and Pt, and a balance being made up of incidental impurities; and
a Au-containing region containing 15 to 50 at.% Au and provided on an outermost surface of the coating layer; wherein
the coating layer is 0.005 to 0.070 µm in thickness, and
a thickness of the Au-containing region is 0.001 to 0.050 µm.

* * * * *